United States Patent [19]

Noguchi et al.

[11] Patent Number: 4,935,802

[45] Date of Patent: Jun. 19, 1990

[54] EPROM IC HAVING REDUCED IMPURITY REGIONS

[75] Inventors: Takeshi Noguchi; Kazuaki Miyata, both of Itami, Japan

[73] Assignee: Mitsubishi Denki Kabushiki Kaisha, Tokyo, Japan

[21] Appl. No.: 418,894

[22] Filed: Oct. 4, 1989

Related U.S. Application Data

[63] Continuation of Ser. No. 160,057, Feb. 25, 1988, abandoned.

[30] Foreign Application Priority Data

Sep. 21, 1987 [JP] Japan .................. 62-238429

[51] Int. Cl.$^5$ ............... H01L 29/78; H01L 27/02; H01L 29/34
[52] U.S. Cl. .................... 357/54; 357/23.3; 357/23.4; 357/23.5; 357/23.8; 357/41
[58] Field of Search ............. 357/23.3, 23.4, 23.5, 357/23.8, 41, 54; 365/185

[56] References Cited

U.S. PATENT DOCUMENTS

| | | | |
|---|---|---|---|
| 4,536,944 | 8/1985 | Bracco et al. | 357/23.5 |
| 4,622,737 | 4/1986 | Ravaglia | 357/23.5 |
| 4,656,492 | 9/1987 | Sunami et al. | 357/23.5 |
| 4,811,075 | 3/1989 | Eklund | 357/23.4 |

FOREIGN PATENT DOCUMENTS

| | | | |
|---|---|---|---|
| 0228815 | 9/1987 | European Pat. Off. | 357/23.5 |
| 59-148370 | 8/1984 | Japan . | |
| 60-198780 | 10/1985 | Japan | 357/23.4 |
| 60-247975 | 12/1985 | Japan . | |

OTHER PUBLICATIONS

M. Woods, "Motion Analysis of EPROM and Various Ways of Inspection" *Nikkei Electronics* (Jan. 1981) pp. 181-201.

J. Sasaki, "Fine CMOS Process which Compares 256K SRAM", *Electron Materials* (Jun. 1985) pp. 35-39.

Primary Examiner—J. Carroll
Attorney, Agent, or Firm—Townsend and Townsend

[57] ABSTRACT

A semiconductor integrated circuit which is of entire microstructure so as to reduce a gate length as to an EPROM formed on a substrate, thereby increasing the quantity of a current flowing between a source and a drain and, on the other hand, a transistor portion other than the EPROM on the same substrate is of structure for weakening the electric field between the source region and the drain region by means of the LDD technique or the like, thereby preventing the occurrence of a breakdown in the channel caused by hot electrons.

1 Claim, 4 Drawing Sheets

EPROM IC HAVING REDUCED IMPURITY REGIONS

This is a continuation of application Ser. No. 07/160,057, filed Feb. 25, 1988, now abandoned.

BACKGROUND OF THE INVENTION

1. Field of the Invention

The present invention relates to a semiconductor integrated circuit, and more particularly to a semiconductor integrated circuit comprising a PROM (Programmable Read Only Memory) having a fine structure of gate length of 1.3 $\mu$m or less and comprising an avalanche type transistor and other transistors for the usual memory or a CPU, the PROM and transistors being constructed in one chip on the same substrate.

2. Description of the Prior Art

FIG. 1 is a sectional side view of the conventional semiconductor integrated circuit comprising an EPROM (Erasable Programmable Read Only Memory) of gate length of 2.0 $\mu$m or more and other transistors for the usual memory or the CPU and the like, the EPROM and transistors being constructed in one chip on the same substrate.

In FIG. 1, a reference numeral 5 designates a P-type substrate, on which each memory cell transistor 11 of N-channel at the EPROM and each transistor 21 of N-channel constituting a usual RAM (Random Access Memory), ROM (Read Only Memory) or CPU (Central Processing Unit), other than the EPROM, are formed.

Each transistor 11 or 21 is a field-effect transistor (FET) comprising respectively a pair of n+-type diffusion layers 1 formed on the surface of the substrate 5 and spaced at a predetermined gap, in other words, putting therebetween a channel so as to constitute a source region and a drain region, gate insulating layers (SiO$_2$ layers) 2 positioned on the diffusion layers 1, and metallic gate electrodes 3 of, for example, poly Si (phosphorous doped), positioned on the gate insulating layers 2 and insulated from the substrate 5.

The memory cell transistor 11 constituting the EPROM forms the gate insulating layer 2 positioned on the substrate 5 as a first gate insulating layer 2a, the gate electrode 3 positioned on the first gate insulating layer 2a as a floating electrode 3a, and a second gate electrode 3 positioned on the floating electrode 3a through a second insulating layer 2b as a control electrode 3b.

In addition, in FIG. 1, a reference numeral 4 designates a field insulating film for insulating and separating transistors.

Recently, the semiconductor integrated circuit tends to be of further microstructure in order to further raise a degree of integration.

Meanwhile, for the EPROM, which uses as a memory cell the field-effect transistor having the floating gate as above-mentioned, it is important that the write-in efficiency of a signal representing data is improved to reduce the write-in time and that the read-out efficiency of the signal representing the data is improved to reduce the read-out time. The write-in efficiency can be improved by increasing the electric field strength in the vicinity of the drain composed of one of the pair of n+-type diffusion layers 1 thereby to increase an injection amount of hot carriers into the floating gate as the second gate electrode 3. The read-out efficiency can be improved by lowering the channel resistance thereby to increase a quantity of current flowing between the source region and the drain region composed of the pair of n+-type diffusion layers 1. For this purpose, a channel length of each memory cell, that is, a distance between the pair of n+-type diffusion layers 1 constituting the source region and drain region need only be reduced.

From the aforesaid requirement for generally high integration of the semiconductor integrated circuit and for improvement in the read-out and write-in efficiency of the EPROM, the semiconductor integrated circuit tends to be of microstructure more and more.

However, when the same construction as the conventional semiconductor integrated circuit of large gate length of 2 $\mu$m or more at each transistor is of microstructure of, for example, gate length of 1.3 $\mu$m, various problems occur at the portions other than the EPROM. In other words, when the gate length is about 1.3 $\mu$m or less, the channel length becomes about equal thereto, so that hot electron is generated to thereby threshold voltage of the memory cell remarkably fluctuates. Hence, the transistors other than EPROM, must adopt the construction such that the electric field between the source region and the drain region of, for example, an LDD (Lightly Doped Drain), that is, the electric field at the channel is weakened for the purpose of improving punch through between source and drain of the field-effect transistor so as to prevent the occurrence of varying threshold voltage caused by hot electrons or the like. However, in a case where such construction for weakening the electric field between the source region and the drain region is applied to all the transistors on the same substrate, generation of an avalanche current between the source and the drain required to write the signal in the EPROM is suppressed, thereby lowering the write-in characteristic of EPROM.

In other words, a high voltage is required to flow between the source region and the drain region because the avalanche current must be generated at the portion of EPROM. On the other hand, at the portion of usual transistor other than the EPROM, the conflicting requirement is created, withstand voltage in raised to prevent breakdown by the hot electrons or the like, in other words, the electric field between the source region and the drain region, that is, at the channel, must be weakened.

For the purpose of solving such problems, for example, the Japanese Patent Laid-Open No. 59-148370 (1984) and No. 60-247975 (1985) have disclosed the following inventions.

The former invention is constituted to make the impurity concentration of the substrate at the portions of the EPROM different from the one at other transistors. Such constitution, however, requires the process of crystal-growing on the essential substrate two substrates different in impurity concentration from each other, whereby the substrate is larger in width as a whole and it is technically difficult to uniformly grow the two substrates different in impurity concentration from each other.

The latter invention usually uses the so-called LDD technique and adopts the construction of making different the EPROM portion from other portions in the impurity concentration formed by the LDD. In this case, however, the LDD processing must be applied twice with different impurity concentrations on the EPROM and other portions, whereby the number of processes increases to create a problem in that surplus masks for photoetching must be prepared.

SUMMARY OF THE INVENTION

In the light of the above circumstances, the present invention has been designed. An object thereof is to provide a semiconductor integrated circuit which can sufficiently highly maintain the write-in and read-out efficiency even when the gate length is minimized to, for example, about 1.3 μm or less, and prevent a varying of threshold voltage caused by the hot electrons or the like in the transistor other than the EPROM.

The semiconductor integrated circuit of this invention is provided with a number of field-effect transistors each having gate electrodes, gate insulating layers, and source regions and drain regions formed at both sides of a channel just under said gate insulating layers, and have a construction of part of said field-effect transistors for weaken the electric field between respective source region and drain region.

The above and further objects and features of the invention will more fully be apparent from the following detailed description with accompanying drawings.

DESCRIPTION OF THE PREFERRED EMBODIMENTS

Next, the present invention will be detailed in accordance with the accompanying drawings.

Figure 1:
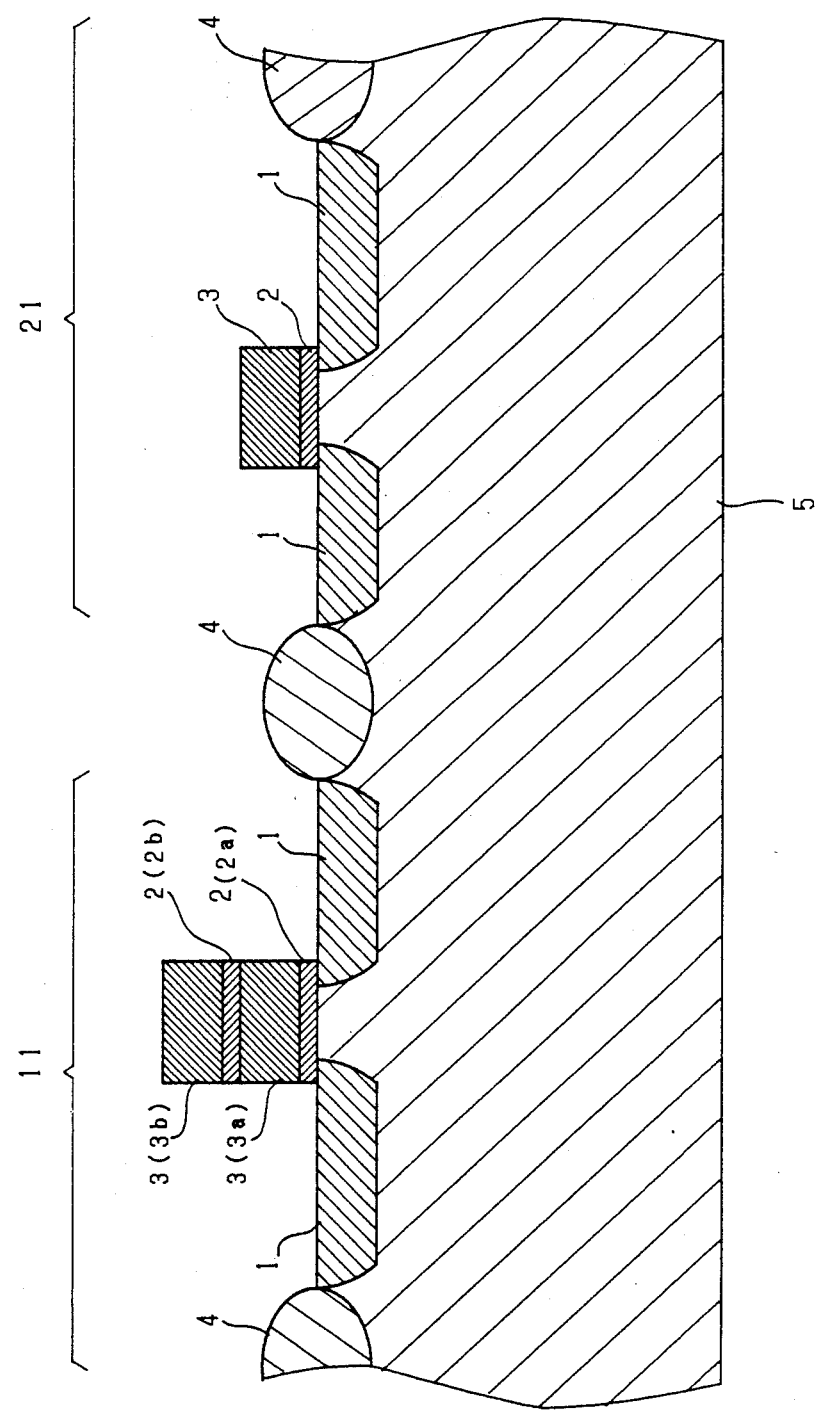
FIG. 1 is a sectional structural side view exemplary of a conventional semiconductor integrated circuit.
Figure 2:
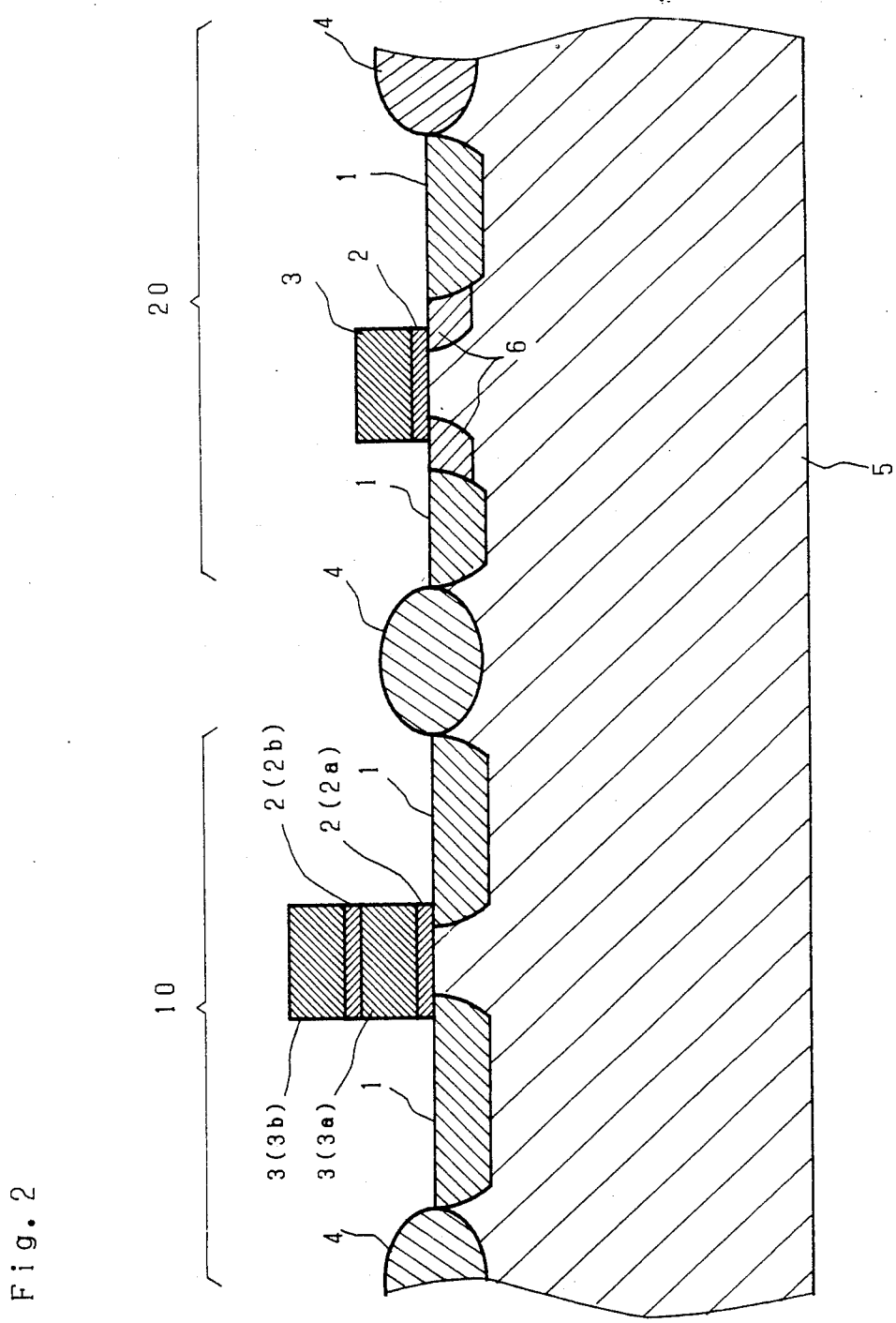
FIG. 2 is a sectional structural side view of a first embodiment of a semiconductor integrated circuit of the invention.

FIG. 2 is a sectional structural side view of a first embodiment of a semiconductor integrated circuit of the invention, the components of the same as or corresponding to those in FIG. 1 being designated by the same reference numerals.

In the drawing, a reference numeral 5 designates a P-type substrate, on which are formed each memory cell transistor 10 of N-channel of an EPROM (Erasable Programmable Read Only Memory) and each transistor 20 of N-channel other than the EPROM, constituting, for example, usual RAM, ROM and CPU.

Each transistor 10 or 20 is a field-effect transistor (FET) comprising a pair of n+-type diffusion layers 1, forming a source region and a drain region on the surface of the substrate 5 and spaced out a predetermined interval, that is, a channel length, gate insulating layers ($SiO_2$ layers) 2 positioned on the diffusion layers 1, and gate electrodes 3 of metal, such as poly Si (phosphorous doped), positioned above the gate insulating layers 2 and being insulated from the substrate 5.

The memory cell transistor 10 constituting the EPROM is so constructed as the gate insulating layer 2 positioned on the substrate 5 forms a first gate insulating layer 2a, a first gate electrode 3 positioned as the first gate insulating layer 2a forms a floating electrode 3a, and a second gate electrode 3 positioned on the floating electrode 3a through a second gate insulating layer 2b forms a control electrode 3b. Such construction of the memory cell transistor 10 is the same as that of the conventional example shown in FIG. 1. However, the semiconductor integrated circuit of the invention is of microstructure with gate length of, for example, about 1.3 μm or less, more refined than the conventional semiconductor integrated circuit.

The usual transistor 20 other than the memory cell transistor 10 forming the EPROM, besides being the microstructure of gate length of, for example, about 1.3 μm or less, more refined than the conventional semiconductor integrated circuit in same way as the memory cell transistor 10, has the following construction characterizing the invention, in other words, weakening the electric field between the source region and the drain region.

The construction characterizing the semiconductor integrated circuit of the invention of weakening the electric field between the source region and the drain region, uses the so-called LDD (Lightly Doped Drain) technique in the first embodiment shown in FIG. 2. Namely, between the channel portion where the gate insulating layer 2 of the transistor 20 contacts directly with the substrate 5 and the pair of n+-type diffusion layers 1 as the source region and drain region, n+-type diffusion layers 6 of impurity concentration lower than that of the n−-type diffusion layers 1 are formed.

In addition, in FIG. 1, a reference numeral 4 designates each field insulating film for insulating and dividing the space between the transistors.

In the first embodiment of the semiconductor integrated circuit of the invention constructed as abovementioned, the entire circuit is so constituted as to have a gate length of about 1.3 μm or less that a quantity of current enough to generate the avalanche current flows between the source and the drain, while, in the transistor 20 other than the EPROM, the n−-type diffusion layers 6 formed by LDD technique exist so as to weaken the electric field between the source region and the drain region, whereby the problem of a breakdown in the channel caused by the hot electrons is not created.

Figure 3:
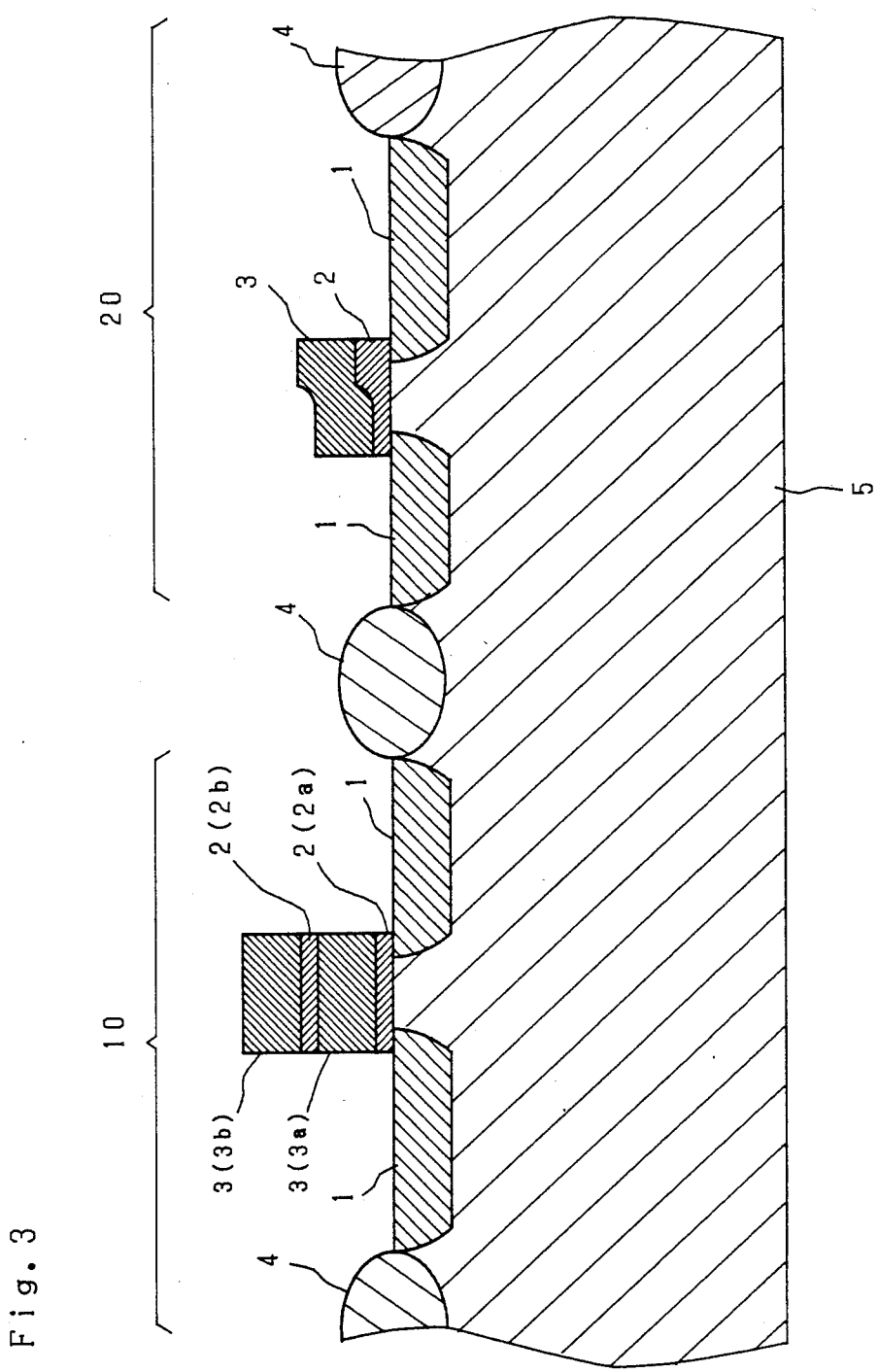
FIG. 3 is a sectional structural side view of a second embodiment of the same.

Next, explanation will be given on a second embodiment of the invention with reference to FIG. 3 showing sectional side view of the semiconductor integrated circuit. In addition, the components shown in FIG. 3 of the same as or corresponding to those shown in FIG. 2 are designated by the same reference numerals.

The second embodiment shown in FIG. 3 is so constructed as a gate insulating layer 2 of silicon oxide ($SiO_2$) is increased in thickness at the drain region side portion of a pair of n-type diffusion layers 1 to thereby weaken the electric field between the source region and the drain region.

Next, explanation will be given on a third embodiment of the invention with reference to the FIG. 4 of sectional side view of the semiconductor integrated circuit of the invention. In addition, in FIG. 4, the components of the same as or corresponding to those shown in FIGS. 2 and 3 are designated by the same reference numerals.

Figure 4:
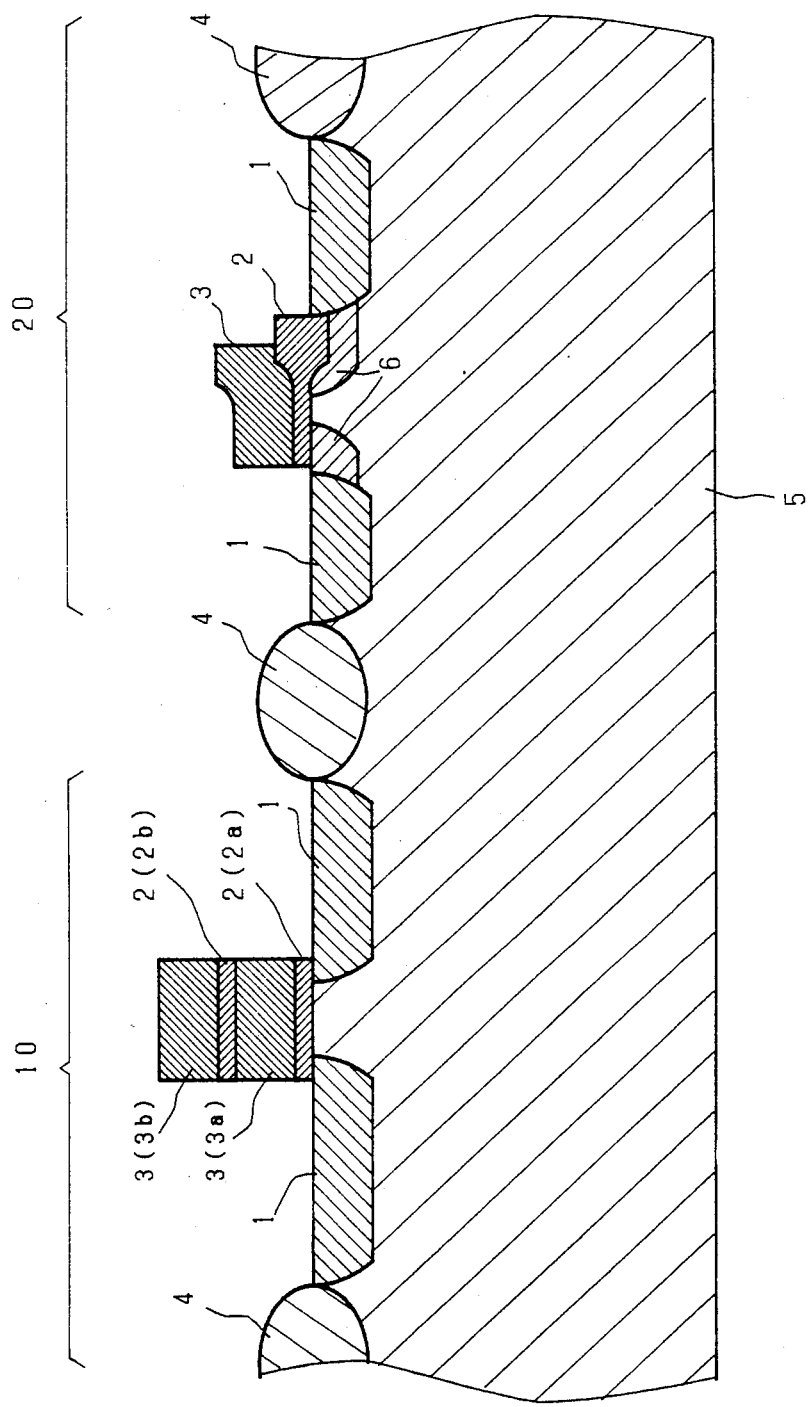
FIG. 4 is a sectional structural side view of a third embodiment of the same.

The third embodiment shown in FIG. 4 is so constructed as a gate insulating layer 2 of silicon oxide ($SiO_2$) is increased in thickness at the drain region side portion of a pair of n+-type diffusion layers 1 and in the space between the n+-type diffusion layers 1, and the channel portion are formed n−-type diffusion layers 6 lower in impurity concentration than the n+-type diffusion layers 1 by use of the LDD technique in as the same way as the first embodiment, thereby weakening the electric field between the source region and the drain region.

As seen from the above, the semiconductor integrated circuit of the invention can be of a microstructure with gate length of about 1.3 μm or less, which forms on the same substrate, that is, on the same chip, the transistor, such as the EPROM, necessary to flow a large avalanche current between the source region and the drain region, and the usual transistor. Moreover, each transistor can demonstrate in good characteristic.

As this invention may be embodied in several forms without departing from the spirit of essential characteristic thereof, the present embodiments are therefor illustrative and not restrictive, since the scope of the invention is defined by the appended claims rather than by description preceding them, and all change that fall within meets and bounds of the claims, or equivalence of such meets and bounds thereof are therefor intended to be embraced by the claims.

What is claimed is:

1. In an integrated circuit, formed on a single semiconductor substrate having a surface, that includes an EPROM having transistors of a first type, in a first area of said substrate and an additional transistor in a second area of said substrate for use in other functional units such as a DRAM or a CPU, and with the integrated circuit having nominally 1.3 micron geometry of less for facilitating a high degree of integration, a structure for the additional transistor comprising:

a gate electrode formed over a predetermined channel region on the surface of the substrate;

first and second dopant regions, characterized by a first dopant concentration, disposed along the surface adjacent to said channel and separated thereby;

a drain region, characterized by a second dopant concentration, disposed adjacent to said first dopant region and separated from said channel thereby;

a source region, characterized by said second dopant concentration, disposed adjacent to said second dopant region and separated from said channel thereby; and a gate insulating layer separating said gate electrode from said channel and having a relatively thick first section overlying a first part of said second area of the substrate and disposed adjacent to said first region and a second section disposed adjacent to said second region with the thickness of the first section being greater than the thickness of the second section with said gate electrode overlying both said first section and said second section of said gate insulating layer and with the first dopant concentration being less than the second dopant concentration to prevent threshold voltage variation and hot electron generation in the additional transistor, wherein said first part of said second area overlain by said relatively thick first section of said gate insulting layer has a single dopant region disposed along the surface, characterized by said first dopant concentration.

* * * * *